United States Patent [19]

Oae et al.

[11] Patent Number: 5,272,347
[45] Date of Patent: Dec. 21, 1993

[54] APPARATUS FOR ADJUSTING A FOCAL POSITION OF AN ELECTRON BEAM AND ELECTRON BEAM PROJECTION APPARATUS INCLUDING THE SAME

[75] Inventors: Yoshihisa Oae; Akio Yamada; Hiroshi Yasuda, all of Kawasaki, Japan

[73] Assignee: Fujitsu Limited, Kanagawa, Japan

[21] Appl. No.: 968,144

[22] Filed: Oct. 29, 1992

[30] Foreign Application Priority Data

Oct. 29, 1991 [JP] Japan ................................. 3-283047

[51] Int. Cl.$^5$ .......................................... H01J 37/141
[52] U.S. Cl. ........................................... 250/396 ML
[58] Field of Search ...................... 250/396 ML, 396 R

[56] References Cited

U.S. PATENT DOCUMENTS 4,306,149 12/1981 Le Poole et al. ............ 250/396 ML
4,968,893 11/1990 Yasuda et al. ..................... 250/492.2

OTHER PUBLICATIONS

"Numerical Analysis of Electron Beam Lithography Systems. Part I: Computation of Fields in Magnetic Deflectors", Munro et al., Optik, vol. 60, No. 4, Mar. 1982, pp. 371-390.

Primary Examiner—Jack I. Berman
Attorney, Agent, or Firm—Nikaido, Marmelstein, Murray & Oram

[57] ABSTRACT

An electron beam projection apparatus providing a magnetic refocusing lens for adjusting a focal position of an electron beam on an object. An axis of an auxiliary magnetic field produced by the magnetic refocusing lens is required equivalently to agree to that of a convergent magnetic field produced by a magnetic object lens. An inclination adjustment apparatus of the magnetic refocusing lens provides a rolling mechanism being independently rotatable on two axes being perpendicular to each other and also perpendicular to a direction of an axis of a convergent magnetic field. With this inclination adjustment apparatus, adjustment operation is improved.

6 Claims, 11 Drawing Sheets

APPARATUS FOR ADJUSTING A FOCAL POSITION OF AN ELECTRON BEAM AND ELECTRON BEAM PROJECTION APPARATUS INCLUDING THE SAME

BACKGROUND OF THE INVENTION

1. Field of the Invention

The present invention relates to an electron beam projection apparatus which produces an auxiliary magnetic field within a convergent magnetic field and adjusts a focal position of a convergent electron beam by changing the intensity of the auxiliary magnetic field. This focal adjustment apparatus is normally called a refocusing lens, therefore, this term is used in the following.

2. Description of the Related Art

The use of an electron beam projection system is well-known as a method for forming minute patterns on large scale integrated circuit semiconductor devices. As the integration density and complexity of a circuit increases, conventional optical lithographic techniques encounter a limit to the production of extremely dense circuit patterns. As a result, another form of pattern-making technique with higher accuracy, such as electron beam lithography, is required. The primary advantage of electron beam lithography is its high resolution capability. Problems due to diffraction effects which are inherent in optical lithography, are resolved by electron beam lithography because the equivalent wavelength of electrons in the 10 to 20 kilovolt energy range is less than 1 angstrom which is substantially smaller than that of an ultraviolet ray.

The electron beam projection apparatus provides an electron source, a beam deflection system in which the beam is deflected in a raster or vector scanning manner, and a magnetic object lens by which the beam is converged onto the object. The electron beam projection apparatus further provides a beam-forming system in which electrons emitted from the electron source are formed into a fine beam having a round or rectangular crosssection. The shape of the electron beam is changed according to the projection patterns on an object. This shaping is performed by passing the electron beam through an aperture arranged in a path of the beam. When the area size of the aperture is changed, the current intensity of the electron beam changes and the focal position also moves in an axis direction of the magnetic object lens. The adjustment of the focal position can be performed by changing the current intensity of the magnetic object lens. However, the response time of the magnetic object lens for changing the focal length is relatively long because the number of turns on a coil of the magnetic object lens is large and a housing of this magnetic object lens is composed of magnetic material. Because the change of the shape of the electron beam is carried out during the pattern projection, the adjustment speed of the focal position is required to be very high. Consequently, the magnetic object lens is not adequate for adjusting the focal position movement due to the change of the beam shape. The refocusing lens is used for this adjustment.

The refocusing lens is arranged within a convergent magnetic field produced by the magnetic object lens and produces an auxiliary magnetic field overlapping the convergent magnetic field of the object lens. The refocusing lens is composed of a coil and its housing. The coil is required to be formed with non-magnetic material such as copper, and the housing is required to be formed with non-magnetic and non-conductive material such as ceramics. The intensity of magnetic field produced by the refocusing lens is extremely smaller than that of the magnetic object lens, for example, 1/1000. The refocusing lens is desirably arranged at the center in the axis direction of the convergent magnetic field produced by the magnetic object lens, and axes of two magnetic fields are required to agree with each other. When the refocusing lens is not arranged at the center in the axis direction of the convergent magnetic field, the refocusing lens cannot efficiently change the focal position of the electron beam. When the axes of two magnetic fields do not agree, the projection position of the electron beam on the object moves according to the intensity fluctuation of the auxiliary magnetic field, and this position movement of the electron beam causes errors in the projection patterns.

As described in above, the refocusing lens is arranged within the convergent magnetic field, that is, within the magnetic object lens. The magnetic object lens provides a small circular bore at the center which the electron beam passes through, and the refocusing lens is required to be arranged within this circular bore. Since the refocusing lens only includes the refocusing coil and does not include a core such as a pole piece which is provided in the magnetic object lens for producing a strong and precise convergent magnetic field, the configuration of the auxiliary magnetic field produced by the refocusing lens cannot be produced so precisely as that of the object lens. Therefore, position and inclination of the refocusing lens opposite to the magnetic object lens are required to be adjusted when the apparatus is fabricated. As described later, the adjustment of the axis position in the direction perpendicular to the axis can be equivalently replaced by the inclination adjustment.

For performing the above adjustment, the conventional apparatus includes an inclination adjustment mechanism in which a movable plate is supported by three points and the inclination of the movable plate is adjusted by changing two positions of the three supporting points. The refocusing lens is fixed to the movable plate of this inclination adjustment mechanism and is suspended into the bore of the magnetic object lens. In an adjustment operation, the inclination of the refocusing lens is adjusted while changing the current of the refocusing coil, and the adjustment operation is completed when the position of the electron beam on the object does not move although the current of the refocusing coil fluctuates.

In the inclination adjustment mechanism used in the conventional apparatus, inclination changes produced by moving supporting points are not independent of each other because the movable plate is supported at three points, therefore, adjustment operations become very complex.

Further, in the inclination adjustment mechanism, the refocusing lens moves in the axis direction according to the change of the plate inclination because the refocusing lens is suspended from the movable plate. When the refocusing lens moves in the perpendicular direction, the focal position of the electron beam moves. In order to adjust this movement of the focal position, the current intensity of the refocusing coil is adjusted. As described above, the efficiency of the refocusing lens contributing to the change of the focal position is maximum when the refocusing lens is arranged at the center of the convergent magnetic field. Therefore, if the refocusing lens moves in the axis direction according to the adjustment of the inclination, there is a problem that the efficiency of the refocusing lens decreases and the current intensity of the refocusing coil becomes large.

SUMMARY OF THE INVENTION

An object of the present invention is to realize an apparatus for adjusting a focal position of an electron beam in which two axes of the convergent magnetic field and the auxiliary magnetic field can be easily adjusted.

Another object of the present invention is to realize a focal position adjustment apparatus in which the refocusing lens does not move in the axis direction when the inclination of the apparatus is adjusted, and which can change the focal position most efficiently.

In a focal position adjustment apparatus according to the present invention, it provides an auxiliary magnetic lens and inclination adjustment means of this auxiliary magnetic lens, and the inclination adjustment means includes a rotation mechanism independently rotatable on two axes which are perpendicular to each other and also perpendicular to the direction of the axis of the convergent magnetic field.

According to another aspect of the present invention, one or two of the rotating axes of the inclination adjusting means passes through a center of the auxiliary magnetic lens.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

The present invention relates to a focal adjustment apparatus included in an electron beam projection apparatus. Therefore, at first, a whole construction of an electron beam projection apparatus is briefly explained.

Figure 1:
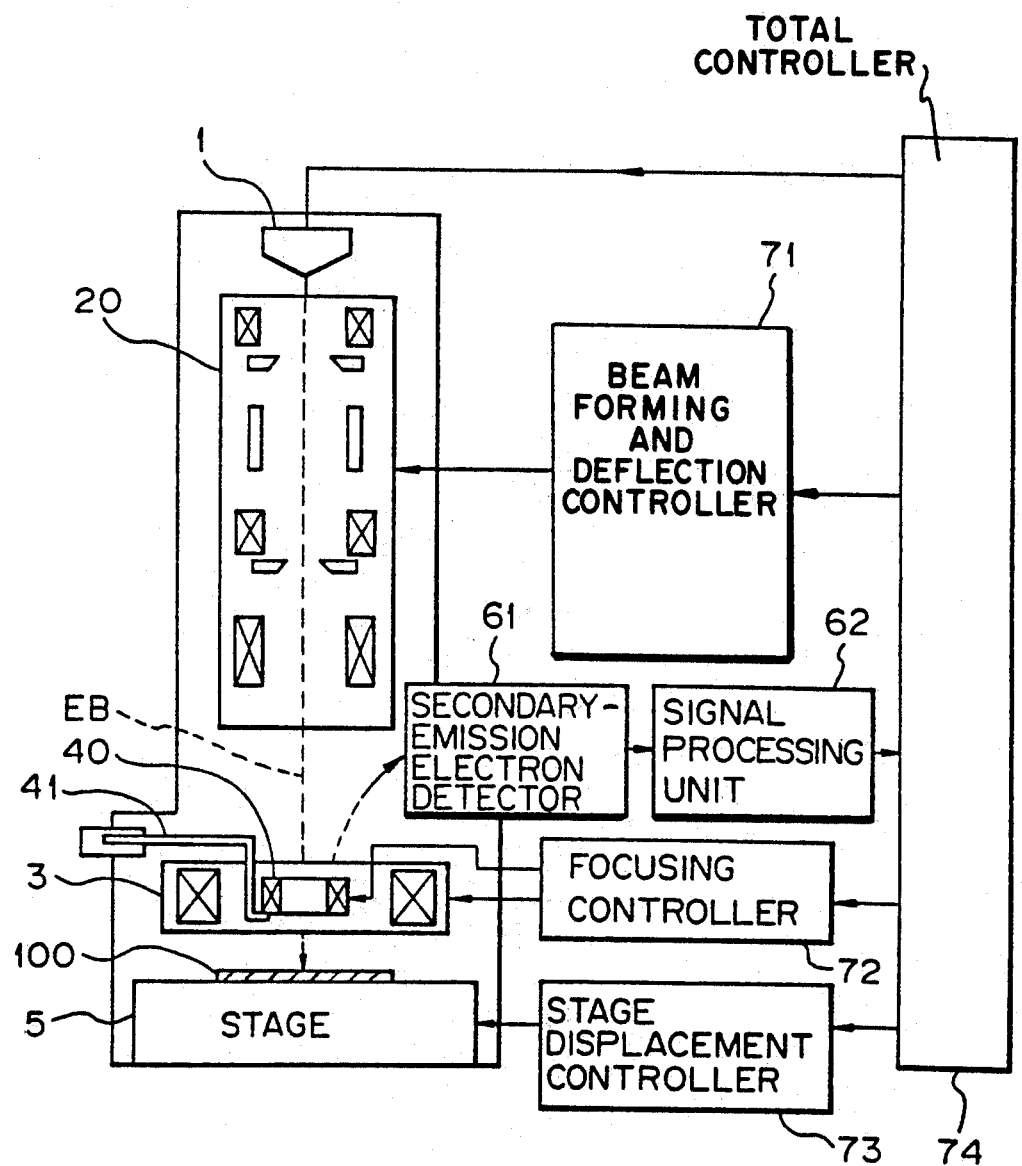
FIG. 1 is a block diagram of an electron beam projection apparatus in accordance with an embodiment of the present invention.

FIG. 1 is a block diagram of an electron beam projection apparatus in which a focal adjustment apparatus according to the present invention is provided. As shown in FIG. 1, the electron beam projection apparatus provides an electron gun 1 for emitting electrons, a beam forming and deflection unit 20, a magnetic object lens 3, a refocusing lens 40, a movable stage 5 on which an object 100 is placed, a secondary-emission electron detector 61 and a controller for controlling the above portions. The reference number 41 designates an arm for adjusting the inclination of the refocusing lens 40 from outside of the apparatus. The beam forming and deflection unit 20 is composed of magnetic lenses, beam forming apertures and electrostatic deflectors. In this beam forming and deflection unit 20, electrons emitted from the electron gun 1 are converged and formed into an electron beam EB, and the electron beam EB is also turned ON and OFF by a beam blanking device included in this unit. In an electron beam exposure apparatus, the electron beam is shaped to have a several configurations corresponding to exposure patterns by passing the beam through a variable aperture in the beam forming and deflection unit 20.

The secondary-emission electron detector 61 detects secondary-emission electrons emitted from a surface of the object 100 on which an electron beam EB is projected, and also detects electrons reflected from the object 100. A signal output from the secondary-emission electron detector 61 is processed at a signal processing unit 62 and input into a total controller 74.

The controller is composed of the total controller 74, a beam forming and deflection controller 71, a focusing controller 72 and a stage displacement controller 73 each of which respectively controls the corresponding portions. The total controller 74 controls the whole system.

The electron beam thus shaped and deflected in response to control signals is converged and projected onto the object 100. When an area size of a crosssection of the electron beam is changed by the aperture, the current intensity of the electron beam changes and the focal position of the electron beam moves in the axis direction. The above focus position movement is also generated when the accelerating voltage of the electron beam is changed. Consequently, when the current intensity of the electron beam changes, the focal position of the electron beam needs to be readjusted according to the current intensity of the electron beam. The adjustment of the focal position can be performed by changing the intensity of the convergent magnetic field. The magnetic object lens 3 is composed of a large coil and a pole piece. The intensity of the convergent magnetic field is changed according to the current intensity of the magnetic object lens. However, since the turns number of a coil of the magnetic object lens is large and a housing of this magnetic object lens is composed of magnetic material, the magnetic object lens 3 cannot quickly change the magnetic field produced by itself. The change of the shape of the electron beam is carried out during the pattern projection, therefore, the adjustment speed of the focal position is required to be very high.

Consequently, the magnetic object lens is not adequate for adjusting the focal position due to the change of the beam shape. Therefore, the refocusing lens 40 is provided for this focal position adjustment.

In the following, functions of the refocusing lens and adjustment operations of axes of both convergent and auxiliary magnetic fields are explained.

Figure 2:
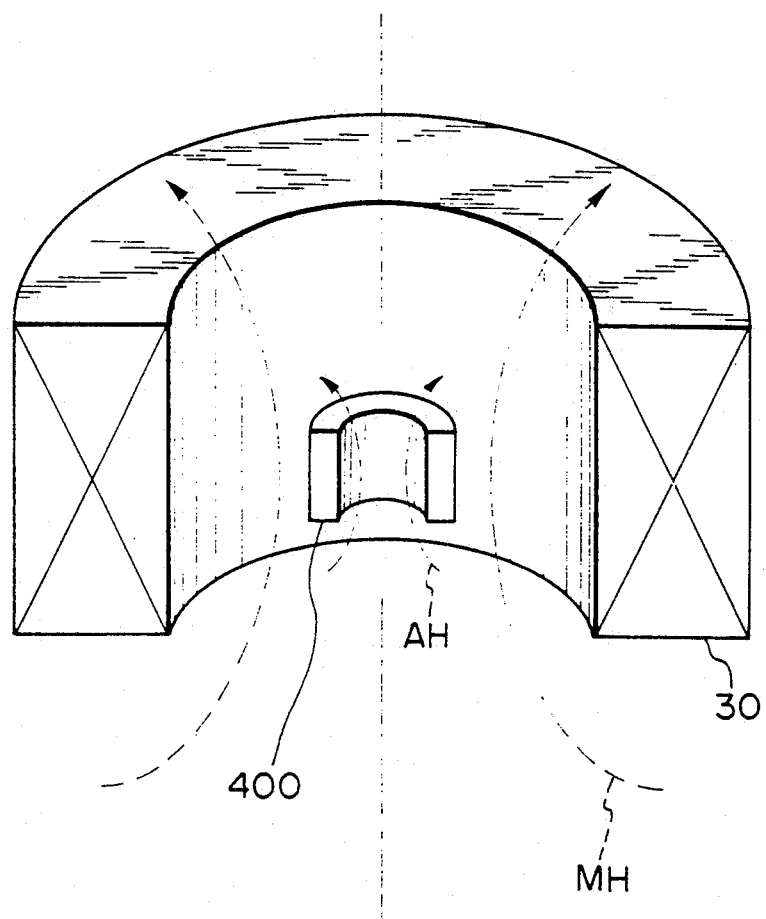
FIG. 2 is a diagram illustrating the arrangement position of the refocusing lens.

FIG. 2 is a diagram illustrating the refocusing lens arranged within the convergent magnetic field produced by the magnetic object lens. In the figure, reference number 30 designates the magnetic object lens, reference number 400 designates the refocusing lens, reference MH designates convergent magnetic fluxes produced by the magnetic object lens 30, and reference AH designates auxiliary magnetic fluxes produced by the refocusing lens 400. The refocusing lens 400 produces an auxiliary magnetic field which overlaps the convergent magnetic field. The refocusing lens is composed of a coil and its housing. Since these elements are required not to disturb the convergent magnetic field, the coil is formed with non-magnetic material such as copper, and the housing is formed with non-magnetic and non-conductive material such as ceramics. The intensity of the auxiliary magnetic field is changed so as to compensate the movement of the focal position according to the intensity change of the electron beam. That is, the auxiliary magnetic field is used only for the adjustment of the focal position. Therefore, its intensity is much smaller than that of the magnetic object lens. For example, the intensity of the convergent magnetic field produced by the magnetic object lens 30 is 2000 ampere-turn, and that produced by the auxiliary magnetic lens 400 is 2 ampere-turn.

Figure 3:
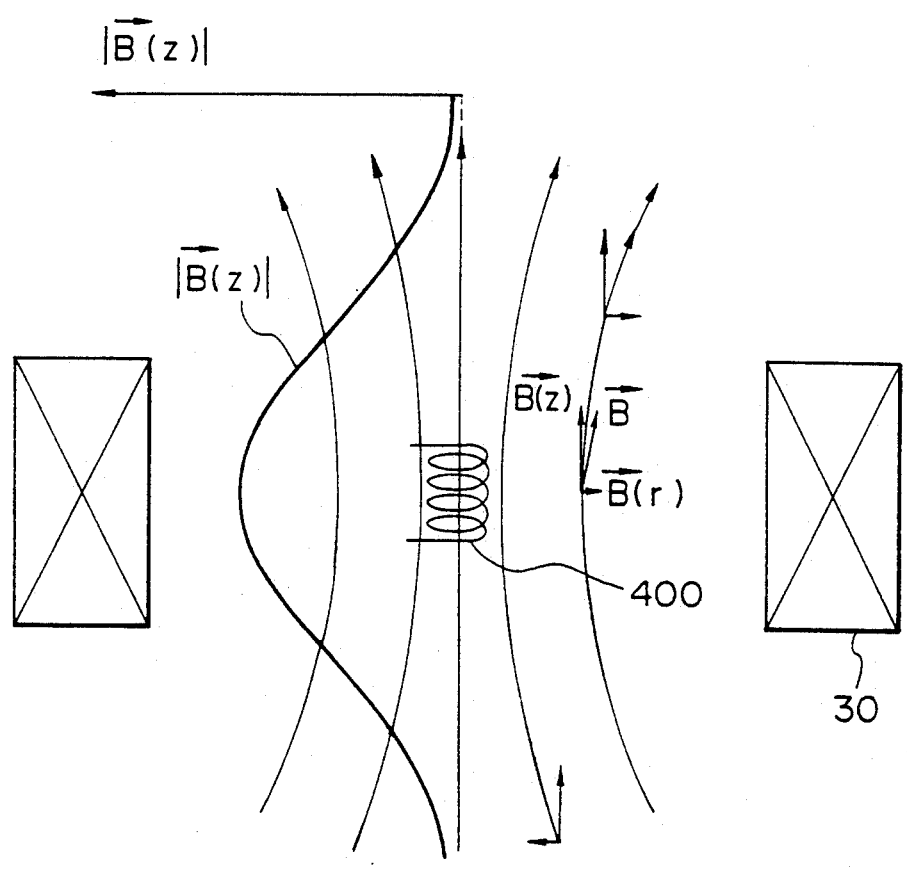
FIG. 3 is a diagram for explaining the differences of the contributing effect according to the different positions of the refocusing lens in the axis direction.

FIG. 3 is a diagram illustrating a distribution of intensities of magnetic fluxes of the convergent magnetic field and an auxiliary magnetic lens arranged on an axis of the convergent magnetic field. In the figure, $\bar{B}$ designates a magnetic flux, $\bar{B}(z)$ designates a component of $\bar{B}$ in a direction parallel to the axis of the convergent magnetic field, and $\bar{B}(r)$ designates a component of $\bar{B}$ in a direction perpendicular to the axis of the convergent magnetic field. In the following, the direction parallel to the axis of the convergent magnetic field is called as an axis direction, and the direction perpendicular to the axis is called as a horizontal direction. As shown in FIG. 3, the distribution of the absolute value of $\bar{B}(z)$ has a maximum value at the center of the magnetic object lens in the axis direction, that is, at the point in which an auxiliary magnetic lens 400b is arranged, and the absolute value of $\bar{B}(z)$ decreases moving away from the center in the axis direction. A focal length f of a magnetic lens shown in FIG. 3 is expressed by the following formula (1).

$$1/f \propto \int_{-\infty}^{+\infty} |B(z)|^2 dz \tag{1}$$

When the refocusing lens is arranged so that two axes of the convergent magnetic field and the auxiliary magnetic field agree with each other, $\bar{B}(z)$ of two overlapped magnetic fields is expressed by a sum of corresponding components of two magnetic fields. Therefore, when refocusing lenses are arranged as shown in FIG. 3, a total focal length including the magnetic object lens and the auxiliary magnetic lens is expressed by the following formula (2).

$$1/f \propto \int_{-\infty}^{+\infty} (|B(z)| + |BR(z)|)^2 dz \tag{2}$$
$$= \int_{-\infty}^{+\infty} \{|B(z)|^2 + 2|B(z)| \cdot |BR(z)| + |BR(z)|^2\} dz$$

wherein, $\bar{B}(z)$ designates a component of the convergent magnetic field, and BR(z) designates a component of the auxiliary magnetic field.

As described above, the intensity of the convergent magnetic field is much larger than that of the auxiliary magnetic field, therefore, $|BR(z)|^2$ can be ignored. Consequently, the above formula (2) becomes the following formula (3).

$$1/f \propto \int_{-\infty}^{+\infty} \{|B(z)|^2 dz + 2|B(z)| \cdot |BR(z)|\} dz \tag{3}$$

In the formula (3), the term $|\bar{B}(z)|^2$ corresponds to an original lens function of the magnetic object lens 30, and the term $2|\bar{B}(z)| \cdot |BR(z)|$ corresponds to a function of the refocusing lens. Therefore, it is apparent that the refocusing lens can change the focal length most efficiently when the refocusing lens is arranged at the position in which $|\bar{B}(z)|$ is maximum, that is, the position at which the refocusing lens 400 is arranged in FIG. 3. If the refocusing lens is arranged apart from the position of maximum $|\bar{B}(z)|$ in the axis direction, the current intensity is required to be increased in order to converge the electron beam at the same position when the refocusing lens is arranged at the position shown in FIG. 3. Consequently, the refocusing lens is desired to be arranged at the center of the convergent magnetic field.

In the above explanation, it is assumed that two axes of the convergent magnetic field and the auxiliary magnetic field agree with each other. However, in practice, it is very difficult to make the axes agree precisely. The refocusing lens does not provide a core such as a pole piece in order not to disturb the convergent magnetic field produced by the magnetic object lens, that is, the auxiliary magnetic field is produced only by the refocusing coil. However, since a precise configuration of the auxiliary magnetic field cannot be made by the coil only, it is impossible to make the axis of the auxiliary magnetic field agree with that of the convergent magnetic field only by mechanical precision. Consequently, an operation for adjusting two axes so as to be agree is performed. In the following, influences when two axes do not agree are explained.

Figure 4:
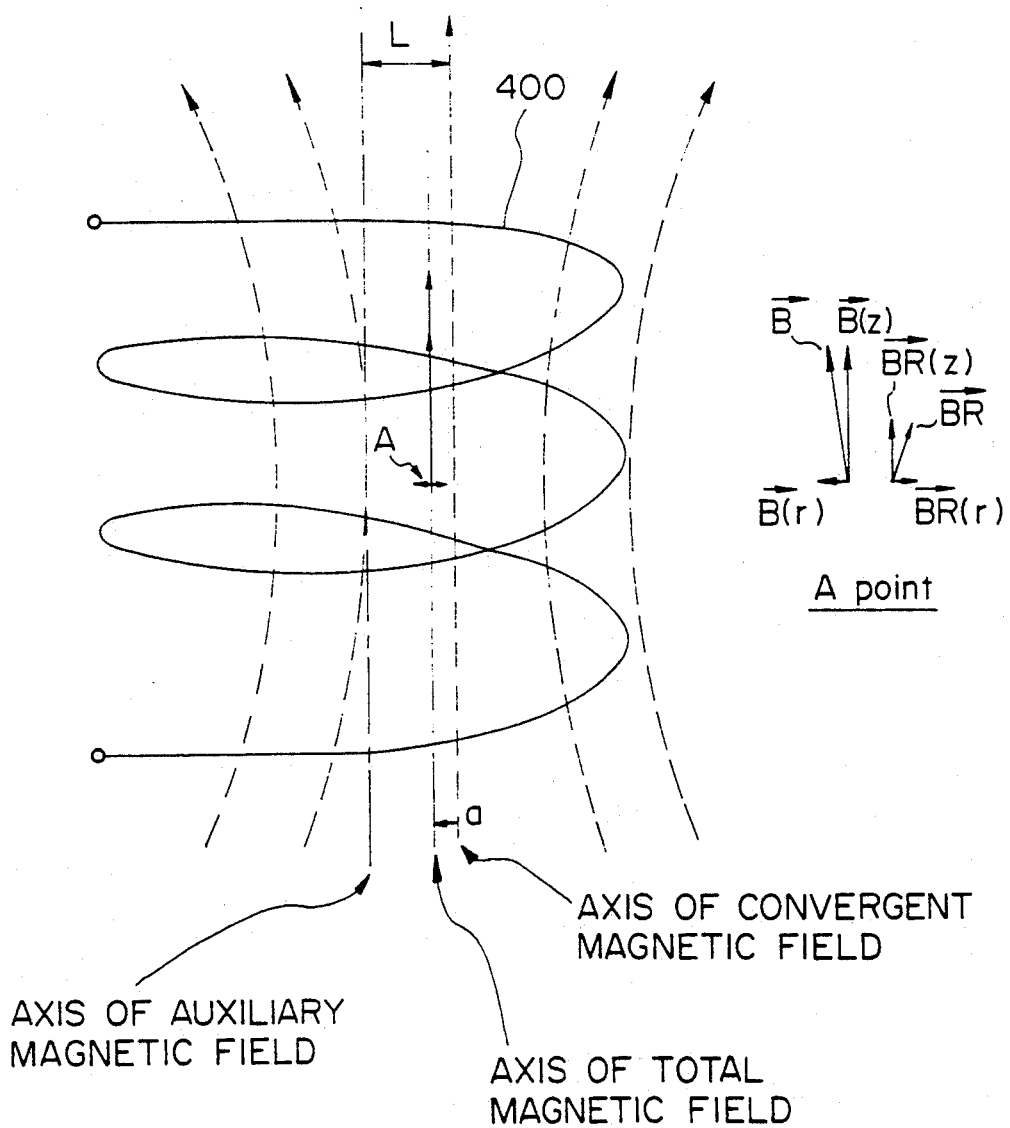
FIG. 4 is a diagram for explaining a movement of the electron beam position when the axis of the auxiliary magnetic field is shifted in parallel opposite to the axis of the converging magnetic field.

FIG. 4 is a diagram illustrating magnetic fluxes when the axis of the auxiliary magnetic field is parallel to that of the convergent magnetic field but moved by the length L in the horizontal direction. A magnetic flux on an axis of a magnetic lens has no component in the horizontal direction. Magnetic fluxes at the positions which are symmetrically opposite to the axis of the magnetic lens respectively have components in the horizontal direction which have the same values but different directions. In FIG. 4, in the area between the two axes of the convergent magnetic field and the auxiliary magnetic field, magnetic fluxes of the convergent magnetic field have components toward the axis of the auxiliary magnetic field, and magnetic fluxes of the auxiliary magnetic field have components toward the axis of the convergent magnetic field. These two components operate so as to compensate each other, and these two components perfectly compensate each other at the position A shown in FIG. 4. Therefore, the magnetic flux on the position A of the total magnetic filed composed of the convergent magnetic filed and the auxiliary magnetic field has no component in the horizontal direction. That is, the axis of the total magnetic field passes through the position A.

At the position A, two components in the horizontal direction cancel each other, therefore, the position A is decided by an intensity ratio of two magnetic fluxes of the convergent magnetic field and the auxiliary magnetic field. Consequently, when the intensity of the auxiliary magnetic flux changes for adjusting the focal position, the axis position of the total magnetic field also changes. The change of the axis position of the total magnetic field causes a movement of the electron beam projection position on the object. Therefore, the two axes of the convergent magnetic field and the auxiliary magnetic field are required to be adjusted so as to agree with each other.

Figure 5:
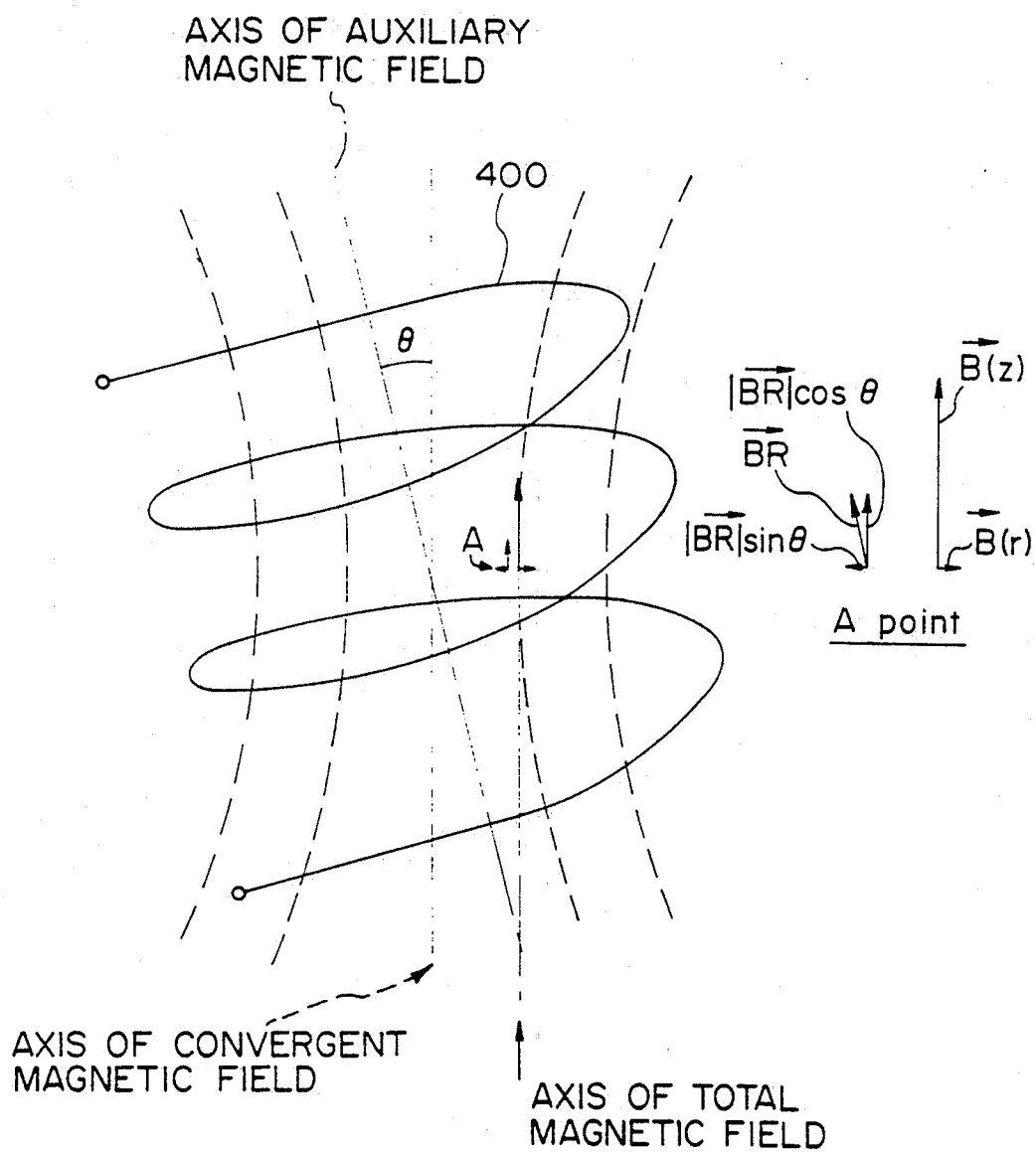
FIG. 5 is a diagram for explaining a movement of the electron beam position when the axis of the auxiliary magnetic field is inclined opposite to the axis of the convergent magnetic field.

FIG. 5 is a diagram illustrating magnetic fluxes when the axis of the auxiliary magnetic field is inclined to that of the convergent magnetic field. In FIG. 5, two axes cross at the centers of respective magnetic fields. By inclining the axis of the auxiliary magnetic field, horizontal components of magnetic fluxes of the auxiliary magnetic field having $|BR| \sin \theta$ in the area neighboring the center. At the position A shown in FIG. 5, the horizontal direction component $\tilde{B}(r)$ of the convergent magnetic field is the same absolute value of the horizontal direction component $|BR| \sin \theta$ as the auxiliary magnetic field, but their directions are opposite to each other. Therefore, a magnetic flux at the point A has no horizontal component because the two horizontal components compensate each other. Since the magnetic flux on the axis of the total magnetic field has no component in the horizontal direction, the axis of the total magnetic field passes through the position A shown in FIG. 5. Since the intensity of the auxiliary magnetic field is changed, the axis position of the total magnetic field moves according to the change of the intensity of the auxiliary magnetic field.

Consequently, when the intensity of the auxiliary magnetic flux is changed for adjusting the focal position, the axis position of the total magnetic field moves and the beam projection position on the object also moves.

As described above, in both cases as shown in FIGS. 4 and 5, the axis position of the total magnetic field composed of the convergent magnetic field and the auxiliary magnetic field moves according to the intensity of the auxiliary magnetic field. Consequently, when two movements of the axis position due to the parallel shift and the inclination have the same absolute values and are opposite in direction, the two movement values perfectly compensate each other. That is, if the above condition is satisfied, the movement of the axis position does not occur when the intensity of the auxiliary magnetic field changes. This means that position and inclination differences between the two axes can be cancelled by only the adjustment of the inclination of the refocusing lens. Therefore, in an adjustment operation of two axes when it is installed in the magnetic object lens, only the inclination of the refocusing lens is adjusted so that two axes equivalently agree.

Figure 6:
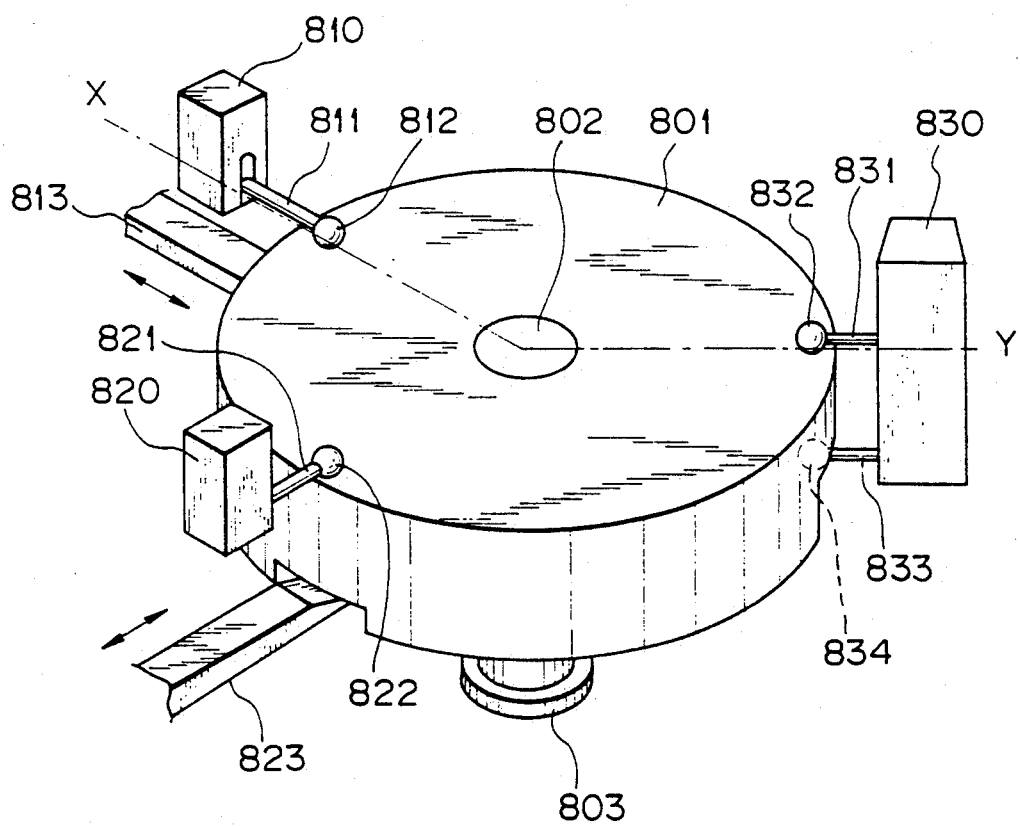
FIG. 6 is a perspective view of a prior art inclination adjustment apparatus of a refocusing lens.
Figure 7:
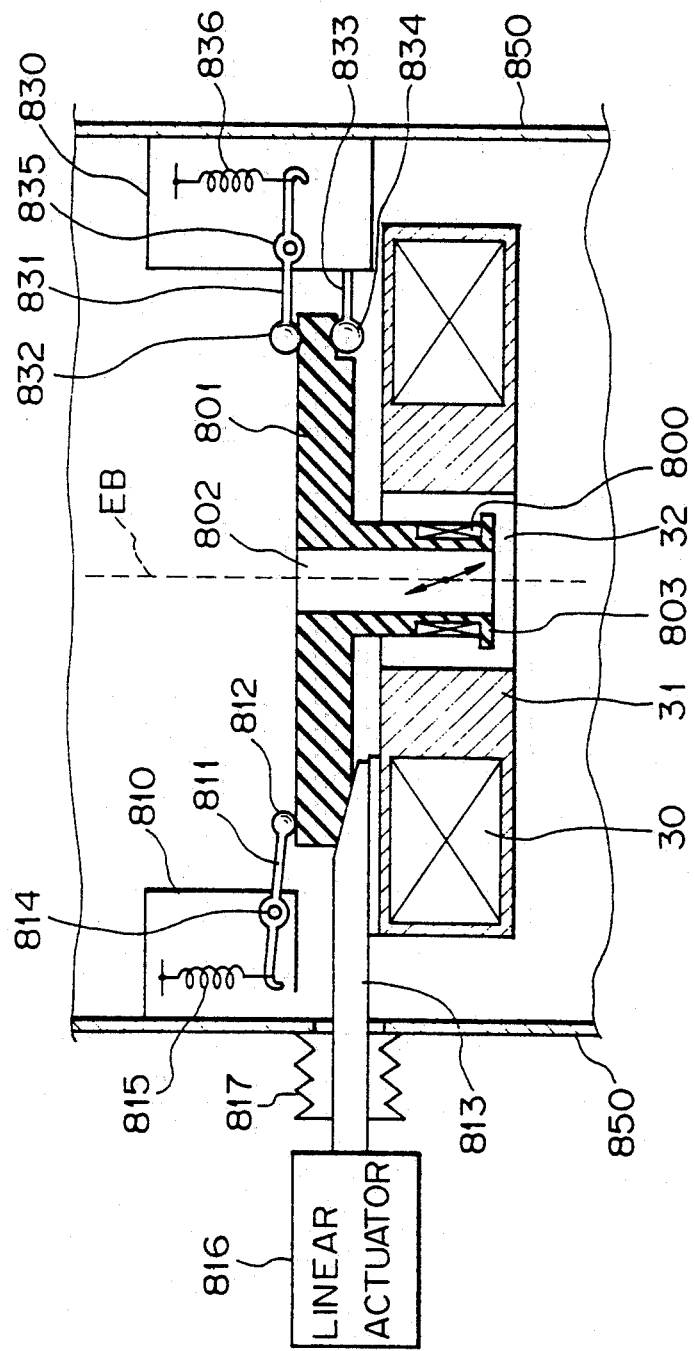
FIG. 7 is a cross-sectional view of a lower part of an electron beam projection apparatus including the inclination adjustment apparatus shown in FIG. 6.

FIG. 6 is a perspective view of a prior art inclination adjustment apparatus of the refocusing lens, and FIG. 7 is a cross-sectional view of a lower part of an electron beam projection apparatus including the inclination adjustment apparatus shown in FIG. 6. A cutting line of the cross-sectional view of FIG. 7 is a line X-Y shown in FIG. 6.

As shown in FIG. 6, this inclination adjustment apparatus provides a movable plate 801. This movable plate 801 is supported at three points, and is fixed by pressing at these three points from above. One of these three points is supported by a fixed sphere 834 and the other two points are supported by two linear arms 813, 823. The ends of these linear arms 813, 823 are oblique, and portions of the movable plate 801 contacting the linear arms are also oblique. Therefore, when each linear arm moves in the length direction, the level of the contacting portion changes and the inclination of the movable plate 801 changes. That is, the inclination of the movable plate 801 can be adjusted by moving the linear arms 813, 823 in the length direction. Boxes 810, 820, 830 hold pressing mechanisms for pressing at these three points from above. The pressing mechanisms provide spheres which are pressed onto the movable plate 801. These spheres are fixed to arms 811, 821, 831. As shown in FIG. 7, these arms 811, 821, 831 are rotatable around a point 814, 834 and pulled up at other sides by springs 815, 836. Therefore, the spheres 812, 822, 832 are pressed onto the movable plate 801. The fixed sphere 834 is fixed to the box 830 via an arm 833.

In FIG. 7, reference number 850 designates a wall of an apparatus, and the space within this wall 850 is evacuated to form a vacuum. Reference number 30 designates a coil of a magnetic object lens, reference number 31 designates a pole piece. The coil 30 and the pole piece 31 form a magnetic object lens. The magnetic object lens provides a bore 32 at the center. As shown in FIG. 7, the movable plate 801 is arranged in an upper space of the magnetic object lens, and the boxes 810, 820, 830 are fixed to the wall 850. In this way, the movable plate 801 can be inclined to the magnetic object lens.

The movable plate 801 provides an extended portion 803 at the center which extends into the bore 32 of the magnetic object lens. A coil 800 for producing an auxiliary magnetic field is held at this extended portion 803. That is, this extended portion corresponds to the abovementioned housing of the auxiliary magnetic lens. The linear arm 813 is moved by a linear actuator 816. The linear actuator 816 is arranged outside of the wall 850, therefore, a bellows 817 is provided for separating the linear actuator 816 from inside of the wall 850. The linear arm 823 is also actuated by the same mechanism. In this way, the inclination of the movable plate 801 can be adjusted from outside.

As described above, the position of the electron beam on an object does not change according to the current intensities of the electron beam. Therefore, in an adjustment operation in the prior art apparatus shown in FIGS. 6 and 7, the inclination of the movable plate 801 is adjusted while changing the current of the coil 800, and the adjustment operation is completed when the position of the electron beam on the object does not change although the current of the coil 800 fluctuates.

The inclination of the movable plate 801 is adjusted by respectively moving the linear arms 813, 823. However, since the movable plate 801 is supported at three points, the inclination changes due to position movements of supporting points are not independent. Therefore, the adjustment is gradually performed by mutually changing the linear arms to be moved. As a result, the adjustment operation is very complex, and a very long time is required to complete the adjustment operation.

Further, as shown in FIG. 7, since the movable plate 801 is supported by the fixed sphere 834, the movable plate 801 rotates around this sphere when each of two linear arms moves. As a result, the center of the coil 800, that is, the center of the auxiliary magnetic lens also moves in the axis direction of the auxiliary magnetic lens. As explained above, when the auxiliary magnetic lens moves in the axis direction, there occurs a problem that the auxiliary magnetic lens cannot efficiently change the focus position of the electron beam.

Figure 8:
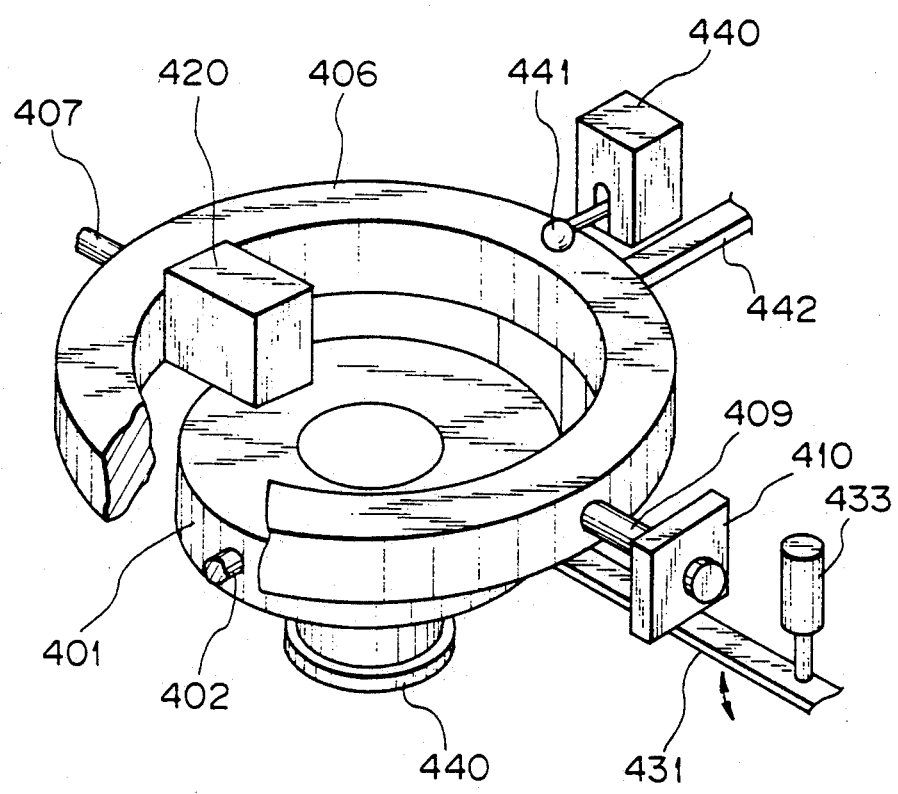
FIG. 8 is a partially broken away perspective view of an inclination adjustment apparatus of a refocusing lens of the first embodiment of the present invention.
Figure 9:
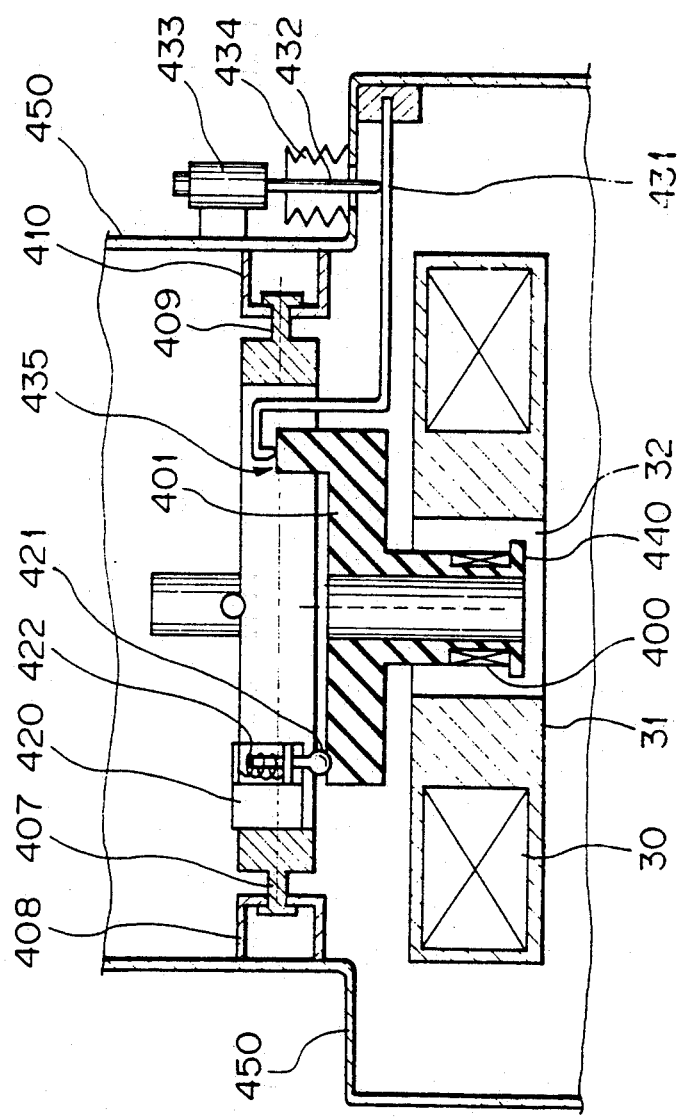
FIG. 9 is a cross-sectional view of a lower part of an electron beam projection apparatus including the inclination adjustment apparatus shown in FIG. 8.

FIG. 8 is a perspective view of an inclination adjustment apparatus of the refocusing lens of the first embodiment of the present invention, and FIG. 9 is a cross-sectional view of a lower part of an electron beam projection apparatus including the inclination adjustment apparatus shown in FIG. 6. In this apparatus, two inclination components of the refocusing lens which are perpendicular to each other can be independently adjusted.

As shown in FIG. 8, the inclination adjustment apparatus provides a first portion 401, a second portion 406, two boxes having pressing mechanisms and arms for adjusting the inclinations of first and second portions. The first portion 401 is held by the second portion 406 and is rotatable around a pair of first rotation axes fixed to the second portion 406. Reference number 402 designates one of these first rotation axes, the other axis is not shown in the figure. The second portion 406 is rotatable around a pair of second rotation axes 407 and 409, and these second rotation axes are fixed to the body of the electron beam projection apparatus. In the following, an imaginary axis passing through the first pair of rotation axes is called a first rotation axis, and an imaginary axis passing through the second pair of rotation axes is called a second rotation axis. When the first and second rotation axes are projected onto a plane perpendicular to the axis of the apparatus, the first rotation axis and the second rotation axis perpendicularly cross. Therefore, rotation components generated by rotations of the first and second portions are independent of each other.

The inclination of the second portion 406 which is rotatable around the second axis is determined by setting the position of a point on surfaces of the second portion. Reference number 442 designates a linear arm which is the same as that shown in FIG. 7, and reference number 440 designates a box the same as that shown in FIG. 7 which provides a pressing mechanism for pressing the upper surface of the second portion 406 by a sphere 441. Therefore, the inclination of the second portion 406 is determined by the contacting point with linear arm 442, and is changed by moving the linear arm 442.

The first portion 401 is rotatable around the first axis, therefore, its inclination is determined by setting the position of a point on surfaces of the first portion. However, since the first axis is fixed to the second portion, the surfaces of the first portion 401 are moved according to the rotation of the second portion 401. Therefore, when the inclination is determined by the point which moves according to the rotation of the second portion 406, the inclination of the first portion 401 changes according to the rotation of the second portion 406. This means that the two rotations around the first and second axes are not independent. To cope with this problem, the box 420 including the pressing mechanism for pressing the surface of the first portion 401 is fixed to the second portion 406. In this way, since the box 420 moves together with the second portion 406, the pressure to the first portion 401 does not change when the second portion 406 rotates. As shown in FIG. 9, the pressing mechanism of the box 420 is different from that of the box 440. In this pressing mechanism, a sphere 421 is pressed by a compression spring 422.

However, the arm which determines the position of the surface point of the first portion 401 cannot be fixed to the second portion 406 because this arm is required to be movable from outside. Therefore, in this apparatus, an arm 431 for adjusting the inclination of the first portion 401 makes contact at a point 435 which is on a center on this line of the second axis as shown in FIG. 9. Since points on this line do not move when the second portion 406 rotates, the inclination component around the first axis is not influenced when the second portion rotates. That is, the two rotations around the first and second axes can be independent. The other end of the arm 431 is fixed to the wall 450 of the apparatus and the end contacting the first portion is held in place by its own elasticity. Reference number 433 designates a micrometer with a movable axis in contact with the arm 431. By adjusting the micrometer, the end 435 of the arm 431 moves in the axis direction. Reference number 434 designates a bellows for separating the micrometer from outside.

In FIG. 9, the space within this wall 450 is evacuated to form a vacuum. Similarly to FIG. 7, reference number 30 designates a coil of a magnetic object lens, reference number 31 designates a pole piece, and reference number 32 designates a bore provided at the center of the pole piece. The coil 30 and the pole piece 31 form a magnetic object lens. In practice, although the pole piece has a more complex configuration, it is drawn in a simple configuration in this figure because the pole piece does not directly relate to the present invention. The inclination adjustment apparatus is arranged at upper space of the magnetic object lens.

The second rotation axes 407 and 409 are fixed to elements 408 and 410 extended from the wall 450.

The first portion 401 provides an extended portion 440 which extends into the bore 32 of the magnetic object lens. A coil 400 for producing an auxiliary magnetic field is held at this extended portion 440. The coil 400 is made of copper, and the first portion 401 is made of ceramics.

As described above, in this inclination adjusting apparatus, two rotation components of the first and second portions are perpendicular to each other. Therefore, in an inclination adjustment operation of the refocusing lens, the two rotation components can be independently adjusted. Consequently, the adjustment operation becomes very easy.

However, in the inclination adjustment apparatus shown in FIG. 8, the center of the refocusing lens also moves in the axis direction according to the rotations of the refocusing lens because the center of the refocusing coil does not agree with both rotation axes. In the second embodiment, this problem is also overcome.

Figure 10:
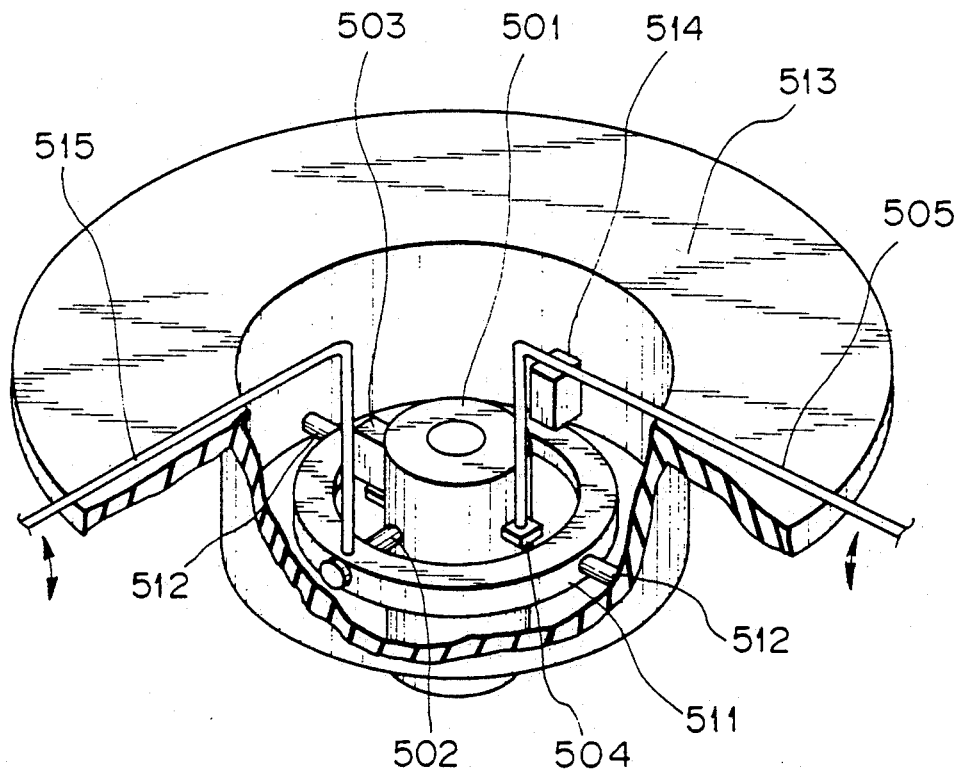
FIG. 10 is a partially broken away perspective view of an inclination adjustment apparatus of a refocusing lens of the second embodiment of the present invention.
Figure 11:
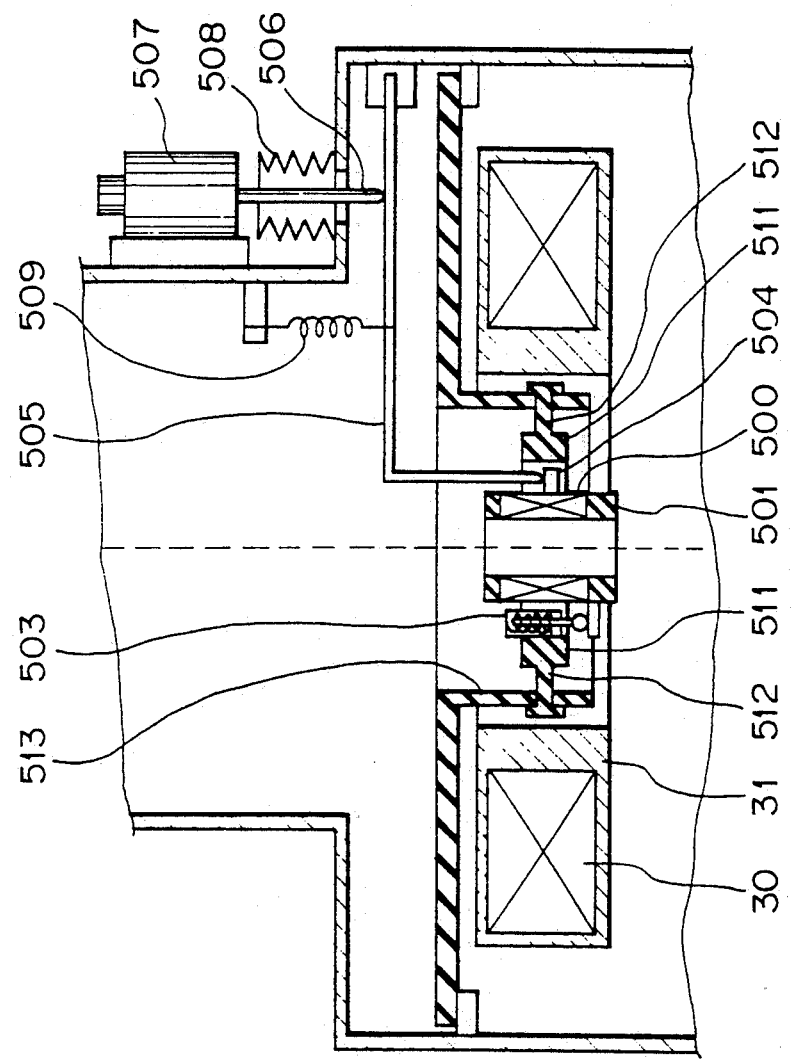
FIG. 11 is a cross-sectional view of a lower part of an electron beam projection apparatus including the inclination adjustment apparatus shown in FIG. 10.

FIG. 10 is a perspective view of an inclination adjustment apparatus of the refocusing lens of the second embodiment of the present invention, and FIG. 11 is a cross-sectional view of a lower part of an electron beam projection apparatus including the inclination adjustment apparatus shown in FIG. 10. Mechanisms used in the second embodiment are almost the same as those used in the first embodiment, therefore, only portions different from the first embodiment are explained.

In FIG. 10, reference number 501 designates a refocusing lens holder which holds a refocusing coil for producing the auxiliary magnetic field. The refocusing lens holder 501 is rotatable around a pair of first axes 502 which are fixed to a ring portion 511. The ring portion 511 is rotatable around a pair of second axes 512 which are fixed to a cylinder element 513. Two axes 502 and 512 perpendicularly cross on the same plane on which the center of the refocusing coil is arranged. Therefore, the refocusing coil is independently rotatable around the center thereof. This means that the center of the refocusing lens does not move when its inclination is changed. Reference numbers 503 and 514 designate boxes providing a pressing mechanism for respectively pressing the refocusing lens holder 501 and the ring portion 511. Reference number 505 and 515 designate adjusting arms for respectively contacting surfaces of the refocusing lens holder 501 and the ring portion 511. The adjusting arm 505 contacts the surface of the element 504 extended from the refocusing holder 501.

As shown in FIG. 11, the cylinder element 513 is arranged in an upper space of a magnetic object lens, and fixed to the wall of the apparatus. The center of the refocusing coil 500, that is, the rotation axes 502 and 512 are arranged at the center of the magnetic object lens. It is noted that the contacting point of the adjusting arm 505 and the element 504 is situated on a center line of the first rotation axis 512. In this way, two components of the inclination of the refocusing lens can be independently adjusted.

By using the inclination adjusting apparatus of the second embodiment, the center of the refocusing lens does not move in the axis direction when the inclination of the refocusing lens is adjusted. therefore, the efficiency of the focal length change is not reduced by the refocusing lens.

When only one of the rotation axes of the inclination adjustment apparatus passes through the center of the refocusing lens, the center of the refocusing lens does not move in the axis direction according to the rotation around one axis, but its center moves according to the rotation around the other axis. However, this adjustment apparatus makes the adjustment operation easier than that of the first embodiment.

What is claimed is:

1. An apparatus for adjusting a focal position of an electron beam converged by a magnetic object lens: comprising an auxiliary magnetic lens arranged in a magnetic field produced by said magnetic object lens, said auxiliary magnetic lens producing an auxiliary magnetic field over said magnetic field produced by said magnetic object lens, and an intensity of said auxiliary magnetic field being changeable;

inclination adjusting means for changing said auxiliary magnetic lens opposite to said magnetic object lens; and said inclination adjusting means including a rotation mechanism being independently rotatable on two axes which are perpendicular to each other and each of which is also perpendicular to a direction of an axis of a convergent magnetic field produced by said magnetic object lens.

2. An apparatus as set forth in claim 1, one of said rotation axes of said inclination adjusting means passing through a center of said auxiliary magnetic lens.

3. An apparatus as set forth in claim 1, both rotation axes of said inclination adjusting means passing through a center of said auxiliary magnetic lens.

4. An electron beam projection apparatus for projecting an electron beam onto an object: comprising a source for generating said electron beam;
 deflection means for deflecting said electron beam;
 convergence means for converging said electron beam;
 detection means for detecting secondary-emission electrons and reflected electrons;
 focus adjustment means for adjusting a convergent condition of said electron beam on said object;
 control means for controlling said electron generation source, said deflection means, said convergence means, said detection means and said focus adjustment means; and
 said focus adjustment means including an apparatus as set forth in claim 1.

5. An electron beam projection apparatus for projecting an electron beam onto an object: comprising a source for generating said electron beam;
 deflection means for deflecting said electron beam;
 convergence means for converging said electron beam;
 detection means for detecting secondary emission electrons and reflected electrons;
 focus adjustment means for adjusting a convergent condition of said electron beam on said object;
 control means for controlling said electron generation source, said deflection means, said convergence means, said detection means and said focus adjustment means; and
 said focus adjustment means including an apparatus as set forth in claim 2.

6. An electron beam projection apparatus for projecting an electron beam onto an object: comprising a source for generating said electron beam;
 deflection means for deflecting said electron beam;
 convergence means for converging said electron beam;
 detection means for detecting secondary emission electrons and reflected electrons;
 focus adjustment means for adjusting a convergent condition of said electron beam on said object;
 control means for controlling said electron generation source, said deflection means, said convergence means, said detection means and said focus adjustment; and
 said focus adjustment means including an apparatus as set forth in claim 3.

* * * * *